United States Patent
Kobayashi

(10) Patent No.: US 10,003,731 B2
(45) Date of Patent: Jun. 19, 2018

(54) IMAGE ELEMENT, AND IMAGING DEVICE AND IMAGING METHOD USING THE SAME FOR ACHIEVING IMPROVED IMAGE QUALITY REGARDLESS OF AN INCIDENT ANGLE OF LIGHT

(71) Applicant: FUJIFILM Corporation, Tokyo (JP)

(72) Inventor: Makoto Kobayashi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days. days.

(21) Appl. No.: 14/498,328

(22) Filed: Sep. 26, 2014

(65) Prior Publication Data

US 2015/0009367 A1 Jan. 8, 2015

Related U.S. Application Data

(63) Continuation of application No. PCT/JP2013/053033, filed on Feb. 8, 2013.

(30) Foreign Application Priority Data

Mar. 28, 2012 (JP) .................................. 2012-074307

(51) Int. Cl.
*G03B 13/00* (2006.01)
*H04N 5/232* (2006.01)
(Continued)

(52) U.S. Cl.
CPC .......... *H04N 5/23212* (2013.01); *G02B 7/34* (2013.01); *H01L 27/14627* (2013.01);
(Continued)

(58) Field of Classification Search
CPC ................ G02B 7/34; H01L 27/14627; H01L 27/14621; H04N 9/045; H04N 5/23212;
(Continued)

(56) References Cited

U.S. PATENT DOCUMENTS 6,819,360 B1 * 11/2004 Ide et al. ................. 348/340
2001/0025904 A1 * 10/2001 Onuki et al. .............. 348/360
(Continued)

FOREIGN PATENT DOCUMENTS

| JP | 2003-7994 A | 1/2003 |
|---|---|---|
| JP | 2009-94339 A | 4/2009 |
| JP | 2010-169709 A | 8/2010 |
| JP | 2010-212649 | 9/2010 |
| JP | 2012-59845 A | 3/2012 |
| WO | WO 2012/008209 A1 | 1/2012 |

OTHER PUBLICATIONS

International Search Report, dated May 7, 2013, issued in PCT/JP2013/053033.

(Continued)

*Primary Examiner* — Twyler Haskins
*Assistant Examiner* — Carramah J Quiett
(74) *Attorney, Agent, or Firm* — Birch, Stewart, Kolasch & Birch, LLP

(57) ABSTRACT

An imaging element which outputs a pair of image signals corresponding to a pair of luminous fluxes which pass through different pupil areas of a photographing optical system, the imaging element includes a first pixel cell group including a plurality of first pixel cells for obtaining the pair of image signals and a second pixel cell group including a plurality of second pixel cells for obtaining the pair of image signals. The first pixel cell includes a first photoelectric converting unit and a first micro lens which is provided above the first photoelectric converting unit. The second pixel cell includes a second photoelectric converting unit and a second micro lens which is provided above the second photoelectric converting unit. The first micro lens and the second micro lens are disposed with different regularities.

14 Claims, 13 Drawing Sheets

(51) Int. Cl.
*G02B 7/34* (2006.01)
*H04N 5/225* (2006.01)
*H04N 5/341* (2011.01)
*H04N 9/04* (2006.01)
*H04N 5/369* (2011.01)
*H01L 27/146* (2006.01)

(52) U.S. Cl.
CPC ....... *H04N 5/2254* (2013.01); *H04N 5/23206* (2013.01); *H04N 5/23245* (2013.01); *H04N 5/341* (2013.01); *H04N 9/045* (2013.01); *H01L 27/14621* (2013.01); *H04N 5/23296* (2013.01); *H04N 5/3696* (2013.01)

(58) Field of Classification Search
CPC .... H04N 5/341; H04N 5/2254; H04N 5/3696; H04N 5/23296
See application file for complete search history.

(56) References Cited

U.S. PATENT DOCUMENTS

| | | | |
|---|---|---|---|
| 2008/0266667 A1* | 10/2008 | Min | H01L 27/14627 359/626 |
| 2009/0115882 A1* | 5/2009 | Kawarada | 348/340 |
| 2010/0214452 A1* | 8/2010 | Kawarada | 348/255 |
| 2013/0127002 A1 | 5/2013 | Okigawa | |
| 2013/0140663 A1 | 6/2013 | Fukuda | |

OTHER PUBLICATIONS

Written Opinion of PCT/JP2013/053033 with English translation dated May 7, 2013.
Chinese Office Action, dated May 26, 2015, for Chinese Application No. 201380016798.2, along with an English translation of the Chinese Office Action and Search Report.

* cited by examiner

IMAGE ELEMENT, AND IMAGING DEVICE AND IMAGING METHOD USING THE SAME FOR ACHIEVING IMPROVED IMAGE QUALITY REGARDLESS OF AN INCIDENT ANGLE OF LIGHT

CROSS REFERENCE TO RELATED APPLICATION

This is a continuation of International Application No. PCT/JP2013/053033 filed on Feb. 8, 2013, and claims priority from Japanese Patent Application No. 2012-074307 filed on Mar. 28, 2012, the entire disclosures of which are incorporated herein by reference.

BACKGROUND

1. Technical Field

The present invention relates to an imaging element, and an imaging device and an imaging method using the same.

2. Related Art

Recently, as the resolution of a solid-state imaging element such as a charge coupled device (CCD) image sensor and a complementary metal oxide semiconductor (CMOS) image sensor becomes higher, a demand for an information device having an imaging function such as a digital still camera, a digital video camera, a cellular phone such as a smart phone, and a personal digital assistant (PDA) is rapidly increasing. In the meantime, the information device having an imaging function as described above is referred to as an imaging device.

However, a focus control method which focuses on a main subject includes a contrast auto focus (AF) method and a phase difference AF method. Since the phase difference AF method may detect a focusing position with high precision at a high speed as compared with the contrast AF method, the phase difference AF method is widely employed in various imaging devices (see, for example, Patent Literature 1 (JP-A-2010-169709)).

Patent Literature 1 discloses a so-called micro lens scaling method which displaces a position of a micro lens which is mounted on a pixel cell for phase difference detection toward a center of a solid-state imaging element as the position goes toward peripheral part of the solid-state imaging element.

SUMMARY

An imaging device having a high magnification zoom function is increasing in recent years. Therefore, an angle (incident angle) of light which is incident onto the solid-state imaging element tends to become broader from a steep angle to a gentle angle.

In the imaging element disclosed in Patent Literature 1, a micro lens of the pixel cell for phase difference detection which is located at a periphery is shifted toward the center thereof. Accordingly, for example, when a zoom magnification is low, an uneven sensitivity is hardly caused in the pixel cell for phase difference detection at the center and the periphery of the imaging element by the scaling effect. However, when the zoom magnification is high, the pixel cell at the periphery does not sufficiently receive the light so that the uneven sensitivity may be caused.

As described above, even though the micro lens is simply scaled, the irregular sensitivity is caused in accordance with the change of a photographing condition so that satisfactory imaging quality may not be maintained.

Illustrative aspects of the present invention are to provide an imaging element, and an imaging device and an imaging method using the same which may achieve satisfactory imaging quality regardless of an incident angle of light.

An aspect of the present invention provides an imaging device including an imaging element which outputs a pair of image signals corresponding to a pair of luminous fluxes which pass through different pupil areas of a photographing optical system, in which the imaging element includes a first pixel cell group including a plurality of first pixel cells for obtaining the pair of image signals and a second pixel cell group including a plurality of second pixel cells for obtaining the pair of image signals, the first pixel cell includes a first photoelectric converting unit and a first micro lens which is provided above the first photoelectric converting unit, the second pixel cell includes a second photoelectric converting unit and a second micro lens which is provided above the second photoelectric converting unit, the first micro lens and the second micro lens are disposed with different regularities, and the imaging device includes: a control unit that selectively performs a first control to adjust a focus of the photographing optical system based on the pair of image signals read from the first pixel cell group and a second control to adjust the focus of the photographing optical system based on the pair of image signals read from the second pixel cell group, depending on an incident angle of light onto the imaging element.

Another aspect of the present invention provides an imaging device including an imaging element which outputs a pair of image signals corresponding to a pair of luminous fluxes which pass through different pupil areas of a photographing optical system, in which the imaging element includes a first pixel cell group including a plurality of first pixel cells for obtaining the pair of image signals and a second pixel cell group including a plurality of second pixel cells for obtaining the pair of image signals, the first pixel cell includes a first photoelectric converting unit and a first micro lens which is provided above the first photoelectric converting unit, the second pixel cell includes a second photoelectric converting unit and a second micro lens which is provided above the second photoelectric converting unit, the first micro lens and the second micro lens are disposed with different regularities, and the imaging device includes: a control unit that selectively performs a first control to generate and record captured image data based on the pair of image signals read from the first pixel cell group and a second control to generate and record the captured image data based on the pair of image signals read from the second pixel cell group, depending on an incident angle of light onto the imaging element.

Another aspect of the present invention provides an imaging element which outputs a pair of image signals corresponding to a pair of luminous fluxes which pass through different pupil areas of a photographing optical system, the imaging element including: a first pixel cell group including a plurality of first pixel cells for obtaining the pair of image signals; and a second pixel cell group including a plurality of second pixel cells for obtaining the pair of image signals; in which the first pixel cell includes a first photoelectric converting unit and a first micro lens which is provided above the first photoelectric converting unit, the second pixel cell includes a second photoelectric converting unit and a second micro lens which is provided above the second photoelectric converting unit, and the first micro lens and the second micro lens are disposed with different regularities.

Another aspect of the present invention provides an imaging method using the imaging element, including: selectively performing a first control to adjust a focus of the photographing optical system based on the pair of image signals read from the first pixel cell group and a second control to adjust the focus of the photographing optical system based on the pair of image signals read from the second pixel cell group, depending on an incident angle of light onto the imaging element.

Another aspect of the present invention provides an imaging method using the imaging element, including: selectively performing a first control to generate and record captured image data based on the pair of image signals read from the first pixel cell group and a second control to generate and record the captured image data based on the pair of image signals read from the second pixel cell group, depending on an incident angle of light onto the imaging element.

According to any one of the aspects, an imaging element which may achieve satisfactory imaging quality regardless of an incident angle of light, and an imaging device and an imaging method using the same may be provided.

DESCRIPTION OF EMBODIMENTS

Hereinafter, an embodiment of the present invention will be described with reference to the drawings.

Figure 1:
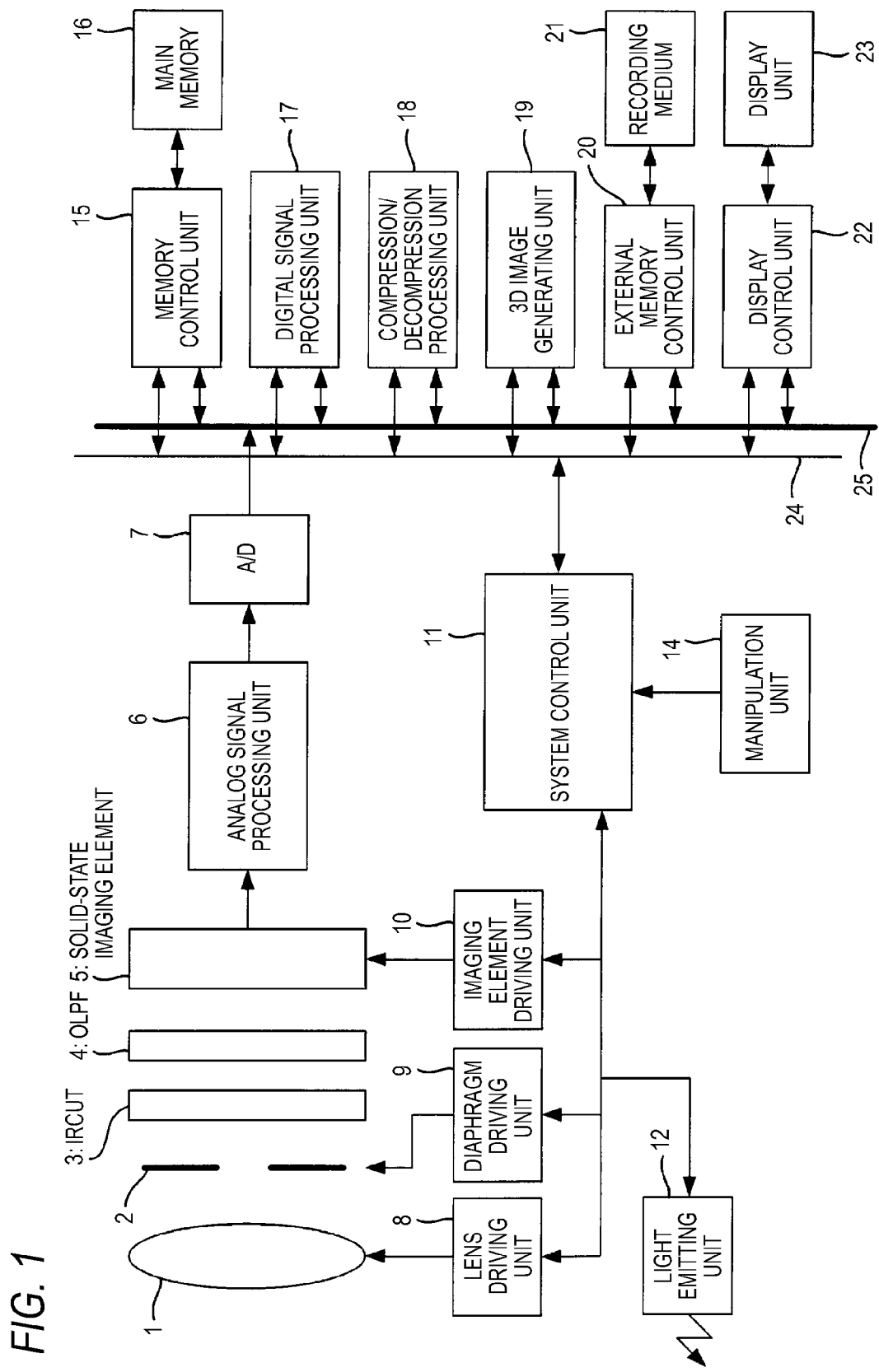
FIG. 1 is a diagram illustrating a schematic configuration of a digital camera which is an example of an imaging device for explaining an embodiment of the present invention.

FIG. 1 is a diagram illustrating a schematic configuration of a digital camera which is an example of an imaging device for explaining an embodiment of the present invention.

An imaging system of an illustrated digital camera includes a single photographing optical system 1 which includes a focus lens and a zoom lens, a solid-state imaging element 5 such as a CCD image sensor or a CMOS image sensor, a diaphragm 2 which is provided between the photographing optical system 1 and the solid-state imaging element 5, an infrared cut filter 3, and an optical low-pass filter 4.

A system control unit 11 which integrally and collectively controls an entire electrical control system of the digital camera controls a flash light emitting unit 12. Further, the system control unit 11 controls a lens driving unit 8 to adjust a position of a focus lens which is included in the photographing optical system 1 or a position of a zoom lens which is included in the photographing optical system. Further, the system control unit 11 controls an aperture opening size of the diaphragm 2 through a diaphragm driving unit 9 so as to adjust an exposure amount.

The system control unit 11 controls an imaging element driving unit 10 to drive the solid-state imaging element 5 to output a subject image captured through the photographing optical system 1 as a captured image signal. An instruction signal from a user is input to the system control unit 11 through an manipulation unit 14.

The electrical control system of the digital camera includes an analog signal processing unit 6 connected to an output of the solid-state imaging element 5 to perform an analog signal processing such as a correlated double sampling processing and an A/D converting circuit 7 which converts a RGB color signal output from the analog signal processing unit 6 into a digital signal. The analog signal processing unit 6 and the A/D converting circuit 7 are controlled by the system control unit 11.

The electrical control system of the digital camera includes a main memory 16, a memory control unit 15 which is connected to the main memory 16, a digital signal processing unit 17, a compression/decompression processing unit 18, a 3D image generating unit 19, an external memory control unit 20 to which a detachable recording medium 21 is connected, and a display control unit 22 to which a liquid crystal display unit 23, mounted on a rear surface of the camera, is connected.

The digital signal processing unit 17 performs an interpolation operation, a gamma correction operation, and an RGB/YC conversion processing on a captured image signal output from the A/D converting circuit 7 so as to generate photographed image data.

The compression/decompression processing unit 18 compresses the captured image data generated in the digital signal processing unit 17 in a JPEG format or decompresses the compressed image data.

The 3D image generating unit 19 generates stereoscopic image data using a plurality of the photographed image data having different points of view (a plurality of photographed image data having parallax) which is obtained by being photographed by the solid-state imaging element 5.

The liquid crystal display unit 23 may display two captured image data having different points of view to be stereoscopically viewed.

The memory control unit 15, the digital signal processing unit 17, the compression/decompression processing unit 18, the 3D image generating unit 19, the external memory control unit 20, and the display control unit 22 are connected to each other by a control bus 24 and a data bus 25 to be controlled by a command from the system control unit 11.

Figure 2:
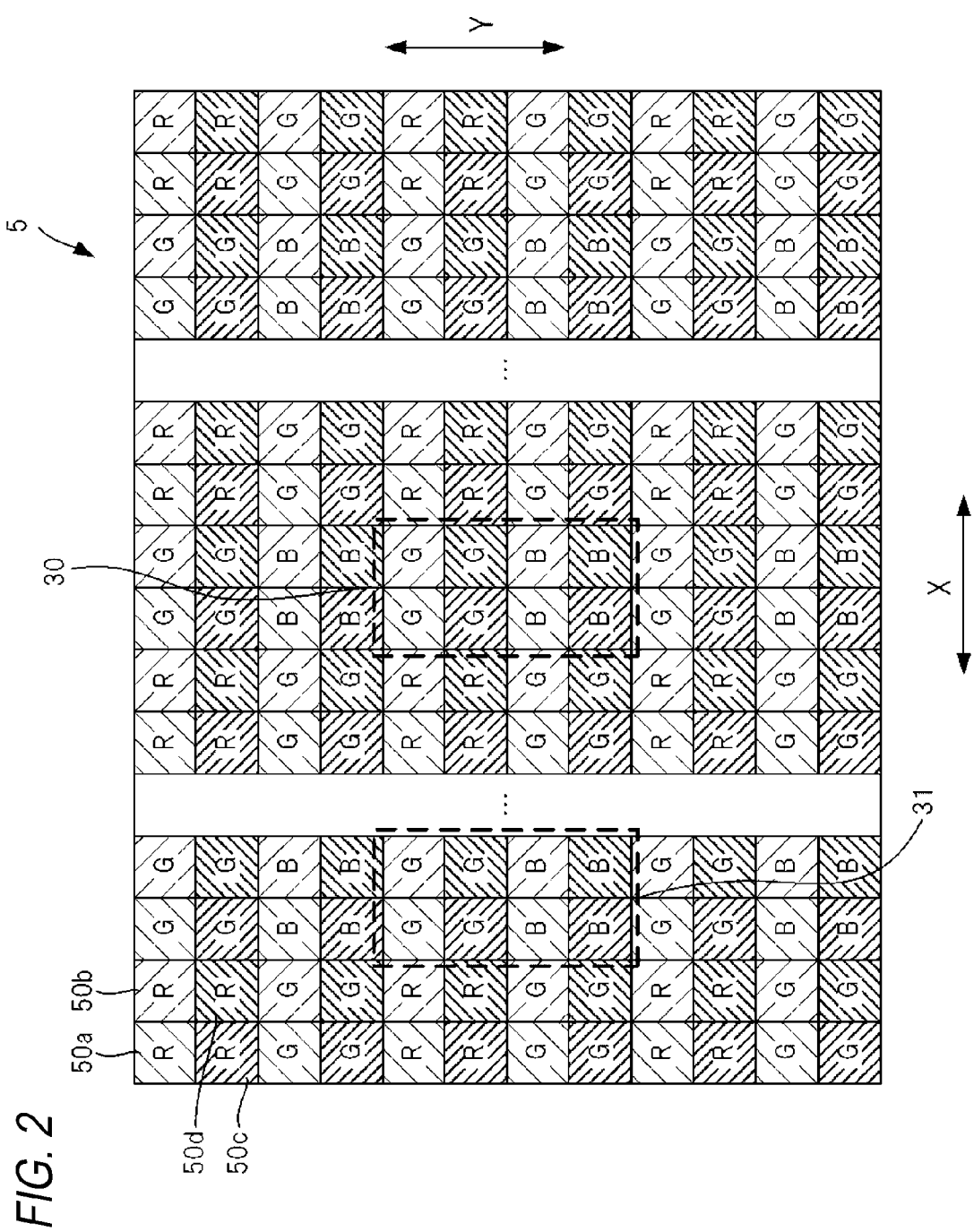
FIG. 2 is a schematic plan view illustrating a schematic configuration of a solid-state imaging element 100 illustrated in FIG. 1.

FIG. 2 is a schematic plan view illustrating a schematic configuration of a solid-state imaging element 5 illustrated in FIG. 1.

The solid-state imaging element 5 includes a pixel cell 50a and a pixel cell 50c configured to obtain one of a pair of image signals which respectively correspond to a pair of luminous fluxes which pass through different pupil areas of the photographing optical system 1, and a pixel cell 50b and a pixel cell 50d configured to obtain the other one of the pair of image signals. Hereinafter, the pixel cells 50a to 50d are not distinguished and referred to as pixel cells 50.

The pixel cells 50 are two-dimensionally (a square lattice shape in an example of FIG. 2) arranged in a row direction X and a column direction Y which is perpendicular to the row direction X. Each pixel cell 50 includes a photoelectric converting unit such as a photodiode.

The arrangement of the pixel cells 50 is configured in such a manner that a plurality of pixel cell rows each of which row including a plurality of pixel cells 50, which is lined up in a row direction X at a predetermined pitch, is lined up in a column direction Y at a predetermined pitch In this arrangement, the odd-numbered rows pixel cell rows are configured by the pixel cells 50a and the pixel cells 50b and the even-numbered pixel cell rows are configured by the pixel cells 50c and the pixel cells 50d.

The pixel cell rows in the odd-numbered row are configured by alternately arranging the pixel cells 50a and the pixel cells 50b in the row direction X.

The pixel cells in the even-numbered row are configured by alternately arranging the pixel cells 50c and the pixel cells 50d in the row direction X.

The pixel cells 50a and the pixel cells 50b receive luminous fluxes which pass through different pupil areas of the photographing optical system 1, respectively. That is, pupils of the pixel cells 50a and 50b in the odd-numbered row are divided and thus a pair of image signals may be obtained by the pixel cells.

The pixel cells 50c and the pixel cells 50d receive luminous fluxes which pass through other different pupil areas of the photographing optical system 1. That is, pupils of the pixel cells 50c and 50d in the even-numbered row are divided and thus a pair of image signals may also be obtained by the pixel cells.

Each of the pixel cells 50a to 50d includes three types of pixel cells, that is, a pixel cell which detects red light, a pixel cell which detects green light, and a pixel cell which detects blue light.

In FIG. 2, a reference character "R" is denoted in a block of the pixel cell which detects red light. In addition, a reference character "G" is denoted in a block of the pixel cell which detects green light. Further, a reference character "B" is denoted in a block of the pixel cell which detects blue light.

As illustrated in FIG. 2, the detecting colors by the pixel cells 50a in the odd-numbered rows are arranged in a Bayer pattern.

The same type (which detects light of the same color) of pixel cells 50b as the pixel cells 50a are disposed, respectively, adjacent to the pixel cells 50a in the same direction (a right direction in the row direction X) with respect to the pixel cells 50a. That is, overall detecting colors by the pixel cells 50b are also arranged in a Bayer pattern.

The same type of pixel cells 50c as the pixel cells 50a are disposed, respectively, adjacent to the pixel cells 50a in the same direction (a lower direction in the column direction Y) with respect to the pixel cells 50a. That is, overall detecting colors by the pixel cells 50c are also arranged in a Bayer pattern.

The same type by pixel cells 50d as the pixel cells 50b are disposed, respectively, adjacent to the pixel cells 50b in the same direction (a lower direction in the column direction Y) with respect to the pixel cells 50b. That is, overall detecting colors by the pixel cells 50d are also arranged in a Bayer pattern.

A first pair of pixel cells are configured by the pixel cell 50a and the pixel cell 50b which is the same type as the pixel cell 50a and is adjacent to the pixel cell 50a at the right side in the row direction X. In addition, a second pair of pixel cells are configured by the pixel cell 50c and the pixel cell 50d which is the same type as the pixel cell 50c and is adjacent to the pixel cell 50c at the right side in the row direction X. The solid-state imaging element 5 is configured in such a manner that the second pair of pixel cells which detect the same color light as the color of the light detected by the first pair of pixel cells are disposed so as to be adjacent to the first pair of pixel cells.

In the meantime, in FIG. 2, the second pair of pixel cells which detect the same color light as the color of the light detected by the first pair of pixel cells are adjacent to the first pair of pixel cells without interposing another pixel cell therebetween, but the two pairs of pixel cells may be configured to be adjacent to each other by interposing another pixel cell therebetween. That is, the second pair of pixel cells which detect the same color light as the color of the light detected by the first pair of pixel cells may be disposed so as to be adjacent to the first pair of pixel cells With regard to each pair of pixel cells, two pixel cells may be disposed to be adjacent to each other.

Figure 3:
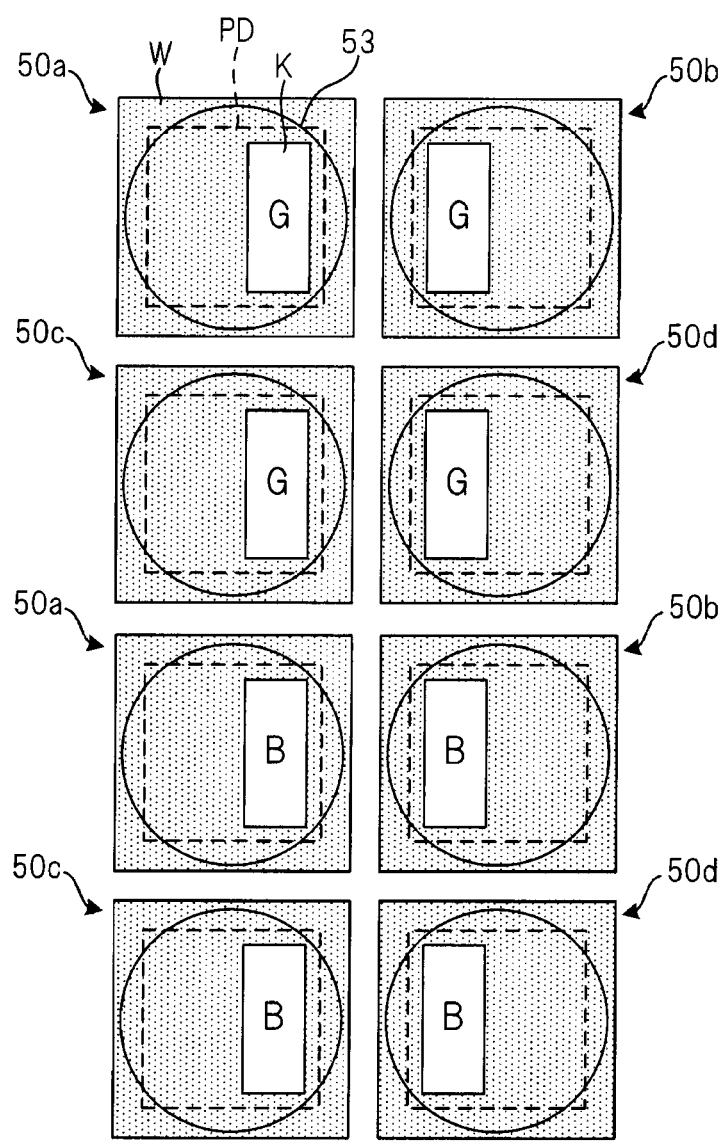
FIG. 3 is an enlarged view of a range 30 in a center of the solid-state imaging element 5 illustrated in FIG. 2.

FIG. 3 is an enlarged view of a range 30 in a center of the solid-state imaging element 5 illustrated in FIG. 2.

Each pixel cell 50 includes a photoelectric converting unit PD such as a photodiode, a micro lens 53 which condenses light onto the photoelectric converting unit PD, and a color filter (not illustrated) disposed therebetween.

Light to the pixel cell 50 is shielded by a light shielding film W and an aperture K of the light shielding film W is formed above the photoelectric converting unit PD. Light enters the photoelectric converting unit PD through the aperture K. In FIG. 3, colors R, G, and B of the light which is detected by the pixel cell 50 are written to be coded in the aperture K.

In the row direction X, center positions of the apertures K of the pixel cells 50a and 50c are off-centered to the right side from the center positions of the micro lenses 53 of the pixel cells 50a and 50c.

In the row direction X, center positions of the apertures K of the pixel cells 50b and 50d are off-centered to the left side from the center positions of the micro lenses 53 of the pixel cells 50b and 50d.

As described above, in the pixel cells 50a and 50c and the pixel cells 50b and 50d, positions of the apertures K are off-centered in opposite directions. Accordingly, an image signal corresponding to one of a pair of luminous fluxes which have passed through different pupil areas of the photographing optical system 1 may be obtained by the pixel cells 50a and 50c and an image signal corresponding to the other one of the pair of luminous fluxes may be obtained by the pixel cells 50b and 50d.

Figure 4:
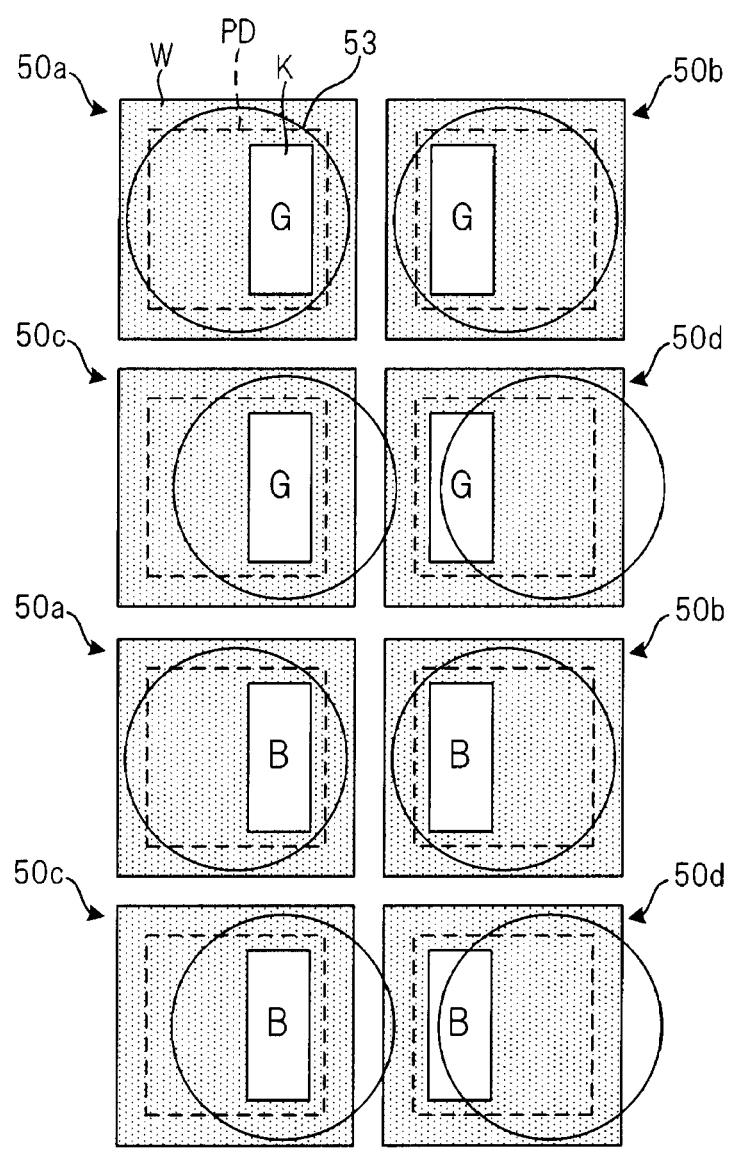
FIG. 4 is an enlarged view of a range 31 in a periphery of the solid-state imaging element 5 illustrated in FIG. 2.

FIG. 4 is an enlarged view of a range 31 in a periphery of the solid-state imaging element 5 illustrated in FIG. 2.

The pixel cell 50a and the pixel cell 50b in the periphery of the solid-state imaging element 5 have the same configuration as the center of the solid-state imaging element 5.

In contrast, the positions of the micro lenses 53 in the pixel cell 50c and the pixel cell 50d are different from that of the center. That is, as compared with the pixel cell 50c and the pixel cell 50d in the center, the center position of the micro lens 53 in the row direction X is shifted toward the center of the solid-state imaging element 5. A shift amount of the micro lens 53 in the pixel cell 50c and the pixel cell 50d is increased as the position goes from the center of the solid-state imaging element 5 to the periphery thereof.

The shift amount of the micro lens 53 in the pixel cell 50c and the pixel cell 50d may be determined as follows.

When a distance from the center of the solid-state imaging element 5 to a diagonal edge is Xo, a distance from the center of the solid-state imaging element 5 of the pixel cell 50c or 50d in a predetermined position is X, a distance from a surface of the photoelectric converting unit included in the pixel cell 50c or 50d to a bottom surface of the micro lens 53 is L, and a gradient of a main ray of the photographing optical system 1 at a diagonal edge of the solid-state imaging element 5 from a perpendicular direction of a surface of the solid-state imaging element 5 is θ, the shift amount of the micro lens 53 in the pixel cell 50c or 50d in a predetermined position is generally obtained by the following Equation 1. However, the present invention is not limited to this equation.

$$\text{Shift amount} = (X/Xo) * L * \tan\theta \quad (1)$$

As described above, in the solid-state imaging element 5, the scaling of the micro lens is performed only in the pixel cell 50c and the pixel cell 50d.

Figure 5:
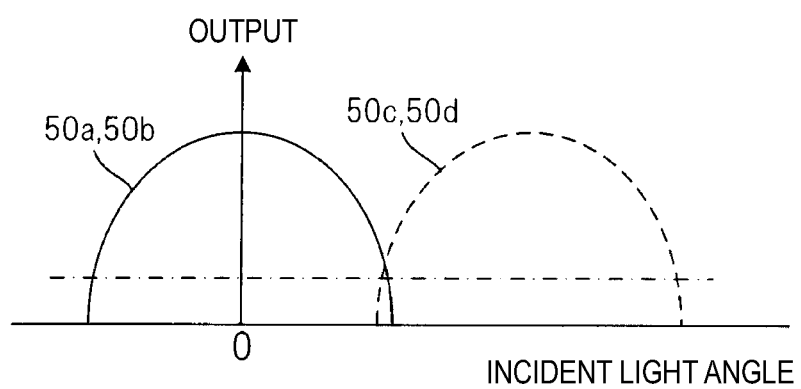
FIG. 5 is a view illustrating sensitivity characteristics of pixel cells 50a and 50b and sensitivity characteristics of pixel cells 50c and 50d in the periphery of the solid-state imaging element 5 illustrated in FIG. 2.

FIG. 5 is a view illustrating sensitivity characteristics of pixel cells 50a and 50b and sensitivity characteristics of pixel cells 50c and 50d in the periphery of the solid-state imaging element 5 illustrated in FIG. 2. In FIG. 5, characteristics represented by reference symbols 50a and 50b indicate the characteristics of the pixel cells 50a and 50b and characteristics represented by reference symbols 50c and 50d indicate the characteristics of the pixel cells 50c and 50d.

As illustrated in FIG. 5, when an angle of incident light is 0°, a signal output of the pixel cell 50a or 50b is maximum and the signal output is decreased as the angle of the incident light is increased. Further, when the angle of the incident light has a constant value in accordance with the shift amount of the micro lens 53, a signal output of the pixel cell 50c or 50d is maximum and the signal output is decreased as the angle of the incident light becomes larger than or smaller than the constant value.

A decreased amount of the signal output may be corrected by shading correction which is performed by the digital signal processing unit 17 of the digital camera illustrated in FIG. 1. However, when the signal output is too small, an S/N of the captured image signal after performing the shading correction is lowered, which degrades image quality. Therefore, the signal output from the pixel cell 50 of the solid-state imaging element 5 is required to be a predetermined value or larger (referred to as an allowable output) and the predetermined value is represented by one-dot chain line in FIG. 5.

In the case of a solid-state imaging element only including a normal pixel cell (that is, a pixel cell in which the pupil is not divided) where the center position of the aperture K coincides with the center position of the micro lens 53, an overlapping range of widths of the incident light angle (an allowable range of an angle of the incident light) in which the allowable output may be obtained may be increased in the center and the periphery in which the micro lens scaling is performed. Therefore, in any case of wide angle photographing and telescopic photographing, the allowable output may be obtained from the pixel cell in the periphery.

However, as compared with a normal pixel cell, in the pixel cell 50, a decreased amount of the signal output with respect to the gradient of the incident light is large so that an allowable range of the incident light angle is smaller than that of the normal pixel cell.

Therefore, in the solid-state imaging element 5, when the scaling is uniformly performed on all pixel cells 50, it is difficult to significantly overlap the allowable range of the incident light angle of the pixel cell 50 in the center with the allowable range of the incident light angle of the pixel cell 50 in the periphery of the solid-state imaging element 5.

In the solid-state imaging element 5, the sensitivity characteristic of the incident angle is changed in the pixel cells 50a and 50b and the pixel cells 50c and 50d in the periphery so that the range of the angle of the incident angle at which the allowable output may be obtained may be increased. As a result, a zoom lens with high magnification may be employed in the photographing optical system 1.

Hereinafter, an operation of the digital camera illustrated in FIG. 1 will be described. In this digital camera, a 3D photographing mode in which stereoscopic image data which is associated with two captured image data obtained by being photographed at different points of view is recorded and a 2D photographing mode in which captured image data obtained by being photographed at one point of view is recorded may be set.

Figure 6:
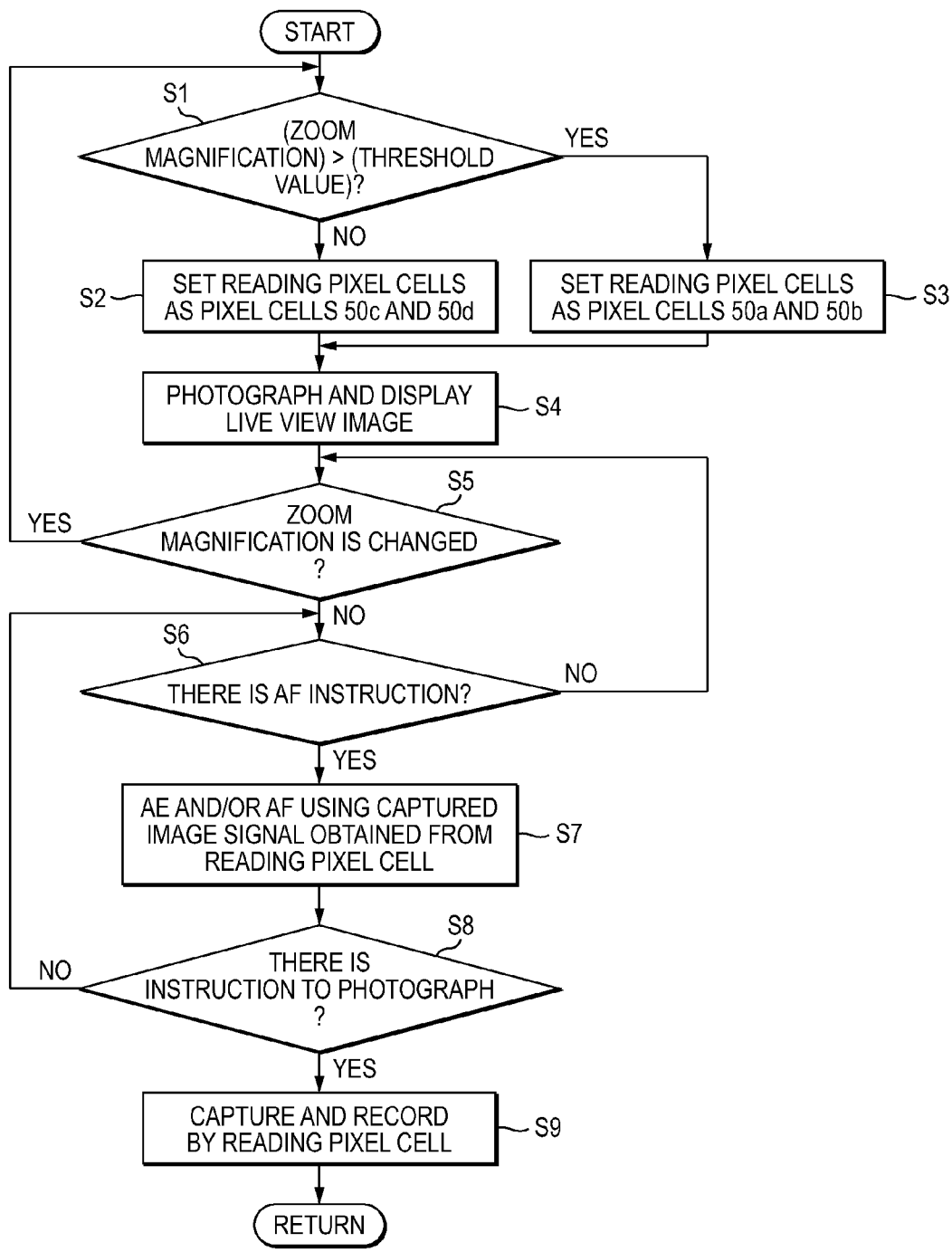
FIG. 6 is a flowchart illustrating an operation in a 3D photographing mode of a digital camera illustrated in FIG. 1.

FIG. 6 is a flowchart illustrating an operation in a 3D photographing mode of a digital camera illustrated in FIG. 1.

When a 3D photographing mode is set, the system control unit 11 detects a position of a zoom lens which is included in the photographing optical system 1 to determine a zoom magnification at a present time from the position at step S1.

When the zoom magnification is equal to or lower than a threshold value (No at step S1), the system control unit 11 sets pixel cells for which a signal is read from the solid-state imaging element 5 as pixel cells 50c and 50d at step S2. In contrast, when the zoom magnification exceeds the threshold value (Yes at step S1), the system control unit 11 sets pixel cells for which a signal is read from the solid-state imaging element 5 as pixel cells 50a and 50b at step S3.

After steps S2 and S3, the system control unit 11 controls the imaging element driving unit 10 to start photographing of a moving image in order to generate a live view image by the solid-state imaging element 5 and display the live view image on a display unit 23 at step S4.

Specifically, when exposure of one frame of the moving image ends, the imaging element driving unit 10 is driven to read the signal only from the pixel cells set in steps S2 and S3. With this driving, the captured image signal corresponding to the pixel cells in the odd-numbered row or the even-numbered row is output from the solid-state imaging element 5.

The digital signal processing unit 17 processes a first captured image signal which is configured by image-captured signals obtained from the pixel cells 50a and 50c, among the output capture-captured image signals, to generate first captured image data. Further, the digital signal processing unit 17 processes a second captured image signal which is configured by image-captured signals obtained from the pixel cells 50*b* and 50*d*, among the captured image signals, to generate second captured image data.

When the first captured image data and the second captured image data are generated, the display control unit 22 displays an image based on the first captured image data and an image based on the second captured image data so as to be stereoscopically displayed on the display unit 23. Therefore, a stereoscopic live view image is checked through the display unit 23.

After displaying the live view image, if the zoom magnification is changed (Yes at step S5), the system control unit 11 returns the process to step S1 and if the zoom magnification is not changed (No at step S5) and there is an instruction to perform automatic exposure (AE) and automatic focus control (AF) (Yes at step S6), the system control unit 11 performs the processing at step S7.

At step S7, the system control unit 11 performs the AE and AF using the captured image signal which is output from the solid-state imaging element 5. The system control unit 11 performs the AF control based on a phase difference of the first captured image signal and the second captured image signal which are included in the captured image signals.

After step S7, when there is an instruction to perform photographing (Yes at step S8), the system control unit 11 controls the imaging element driving unit 10 to perform exposure for main capturing by the solid-state imaging element 5. After the exposure ends, the imaging element driving unit 10 reads a signal from the pixel cells set at step S2 or step S3.

The digital signal processing unit 17 generates first captured image data and second captured image data from the captured image signal output from the solid-state imaging element 5 and generates the captured image data which are associated with each other as stereoscopic image data. The stereoscopic image data is recorded in the recording medium 21 by the external memory control unit 20 at step S9. After step S9, the process goes back to step S1.

In the meantime, an operation in a 2D photographing mode is the same as the operation illustrated in FIG. 6 except that the captured image data generated at step S4 and the captured image data generated at step S9 are different from the 3D photographing mode.

In the 2D photographing mode, when the captured image signal is output from the solid-state imaging element 5 after step S2 or step S3, the digital signal processing unit 17 adds signals obtained from the pair of pixel cells (the pair of the same type of pixel cells 50*a* and 50*c* and the pair of the same type of pixel cells 50*b* and 50*d* which are adjacent to each other in the row direction X), among the captured image signals.

A captured image signal corresponding to a signal obtained by photographing the subject at one point of view may be obtained by the addition processing. The digital signal processing unit 17 processes the captured image signal after the addition processing to generate captured image data. The display control unit 22 displays the image (a non-stereoscopic 2D image) based on the captured image data on the display unit 23 as a live view image.

Similarly, at step S9 in the 2D photographing mode, when the captured image signal is output from the solid-state imaging element 5, the digital signal processing unit 17 adds a signal obtained from the pair of pixel cells, among the captured image signals. The captured image data obtained by processing the captured image signal after the addition processing is recorded in the recording medium 21.

In the meantime, the threshold value which is used in the determination of step S1 of FIG. 6 is set to a value with which optimal image quality may be obtained in accordance with the scaling amount of the pixel cells 50*c* and 50*d*.

As described above, since the digital camera illustrated in FIG. 1 is equipped with the solid-state imaging element 5 including a pixel group (the pixel cells 50*a* and 50*b*) in which the scaling from the center to the periphery is not performed on the micro lens 53 and a pixel group (the pixel cells 50*a* and 50*b*) in which the scaling from the center to the periphery is performed on the micro lens 53, the range of the angle of the incident light onto the solid-state imaging element 5 may be widened without degrading the image quality. As a result, a zoom lens with a high magnification may be employed in the photographing optical system 1 so that a digital camera which is compact and has a high optical zoom magnification may be provided.

In the meantime, in the above description, even though switching is performed to perform the AF or generate an image using any one of the first pixel group and the second pixel group in accordance with a zoom magnification, for example, the incident angle of the light to the solid-state imaging element 5 is changed by an F value of the diaphragm. Therefore, the F value may be used to determine the switching instead of the zoom magnification. That is, it is determined whether to control the AF or generate the image using any one of pixel groups in accordance with the incident angle of the light onto the solid-state imaging element 5.

In the above description, whether to generate a live view image or a recording image by the first pixel cell group which is configured by the pixel cells 50*a* and 50*b* or generate a live view image or a recording image by the second pixel cell group which is configured by the pixel cells 50*c* and 50*d* is selected by the zoom magnification.

However, the live view image or the recording image may be generated using both the first pixel cell group and the second pixel cell group.

For example, the digital camera generates the live view image or the recording image by the second pixel cell group until the zoom magnification reaches the first threshold value. Further, the digital camera generates the live view image or the recording image by both the first pixel cell group and the second pixel cell group until the zoom magnification reaches a value which is larger than the first threshold value and smaller than the second threshold value. Further, when the zoom magnification exceeds the second threshold value, the digital camera generates the live view image or the recording image by the first pixel cell group.

An example in which the live view image or the recording image is generated using both the first pixel cell group and the second pixel cell group will be described.

In the 3D photographing mode, two captured image data generated from the captured image signal which is obtained from the first pixel cell group and two captured image data generated from the captured image signal obtained from the second pixel cell group are added at a ratio in accordance with the zoom magnification and then stereoscopic image data may be generated from two captured image data after having been added. The ratio of the captured image data obtained from the first pixel cell group may be increased as the zoom magnification is increased.

In the 2D photographing mode, one captured image data generated from the captured image signal which is obtained from the first pixel cell group and one captured image data generated from the captured image signal obtained from the second pixel cell group are added at a ratio in accordance with the zoom magnification to generate one captured image data.

By doing this, quality of the captured image is not rapidly changed by the zoom magnification so that the photographing may be manipulated without having a feeling of strangeness.

However, in the above description, the scaling of the micro lens 53 is not performed with respect to the pixel cells 50a and 50b. But, the scaling of the micro lens 53 may be performed with respect to the pixel cells 50a and 50b.

Figure 7:
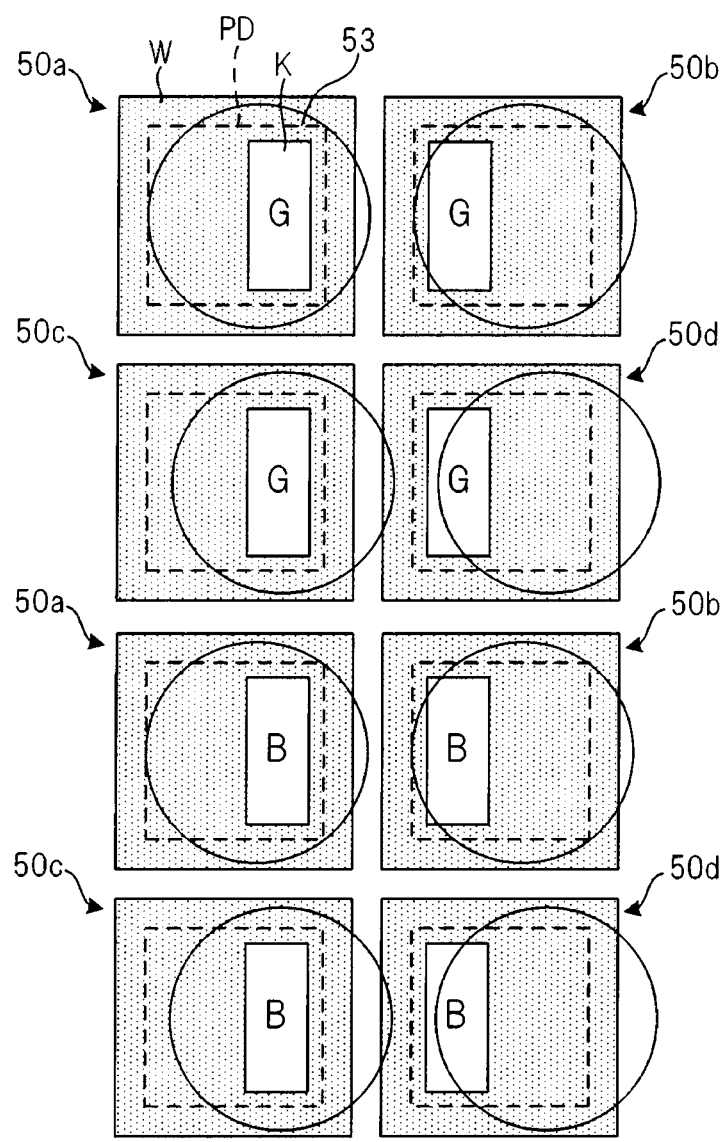
FIG. 7 is a view illustrating a modified example of the solid-state imaging element 5 illustrated in FIG. 2 and corresponds to FIG. 4.

FIG. 7 is a view illustrating a modified example of the solid-state imaging element 5 illustrated in FIG. 2 and corresponds to FIG. 4.

Difference from FIG. 4 is that the position of the micro lens 53 in the pixel cells 50a and 50b is shifted toward the center of the solid-state imaging element 5 with respect to the position of the micro lens 53 in the pixel cells 50a and 50b in the center of the solid-state imaging element 5.

However, shift amounts of the micro lenses 53 in the pixel cells 50a and 50b and the pixel cells 50c and 50d in the same position in the row direction X are different from each other.

When the zoom magnification is high, a range of the angle of the light which is incident onto the solid-state imaging element 5 becomes narrower but the light is obliquely incident onto the pixel cell in the periphery of the solid-state imaging element 5. Therefore, the micro lenses in the pixel cell group configured by the pixel cells 50a and 50b and the second pixel cell group configured by the pixel cells 50c and 50d are displaced with different scaling amounts, thereby achieving high quality photographing.

Hereinafter, other modified examples of the solid-state imaging element 5 will be described.

Figure 8:
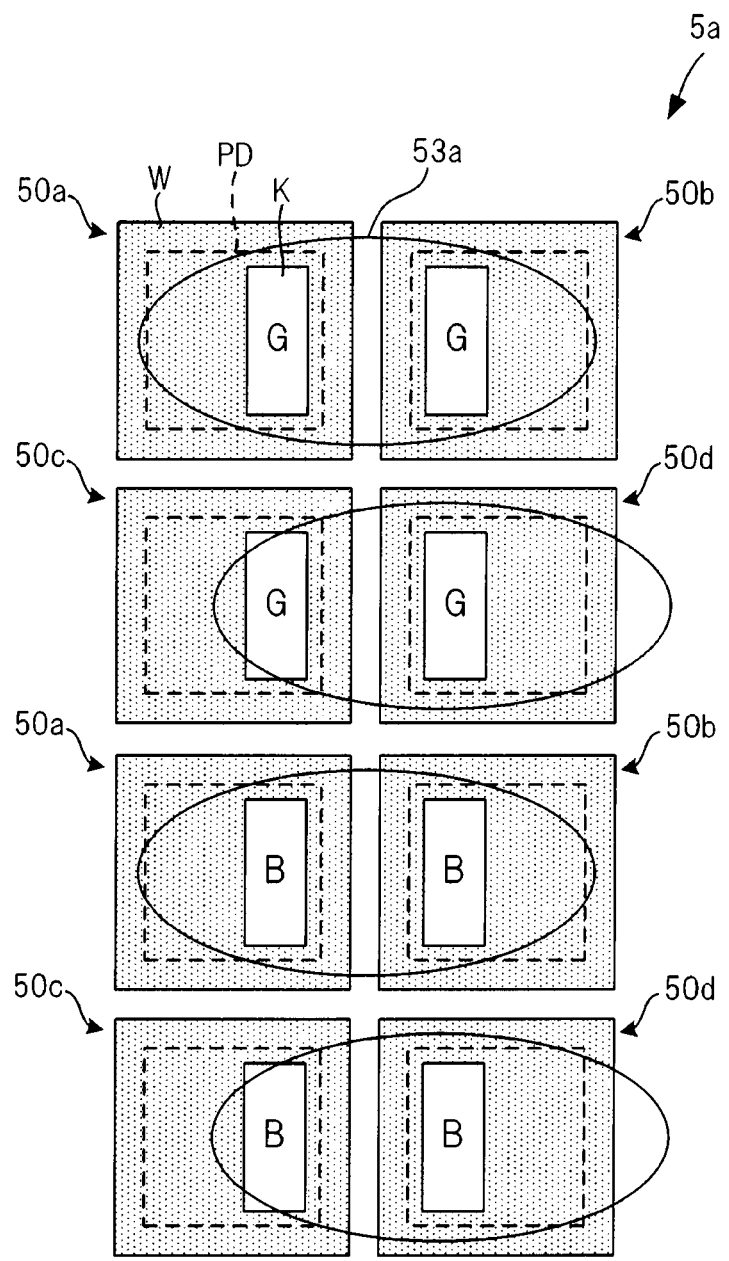
FIG. 8 is a plan view illustrating a configuration in a periphery of a solid-state imaging element 5a which is a modified example of the solid-state imaging element 5 illustrated in FIG. 2.

FIG. 8 is a plan view illustrating a configuration of the periphery of a solid-state imaging element 5a which is a modified example of the solid-state imaging element 5 illustrated in FIG. 2.

The solid-state imaging element 5a is different from the solid-state imaging element 5 in that one micro lens 53a is provided so as to correspond to two pixel cells 50 which configure a pair of pixel cells, rather than providing one micro lens for each pixel cell 50.

As illustrated in FIG. 8, the micro lens 53a has an ellipsoidal shape and is disposed across two pixel cells 50 which configure the pair of pixel cells. The scaling of the micro lens 53a is the same as that of the micro lens 53. That is, a micro lens 53a corresponding to the pixel cells 50a and 50b and a micro lens 53a corresponding to pixel cells 50c and 50d are arranged with different regularities.

With this configuration, light which is incident onto two pixel cells 50 below the micro lens 53a may be split only by the micro lens 53a. That is, even when an aperture K in the pixel cell 50 is enlarged in the row direction X, a pupil division performance may be maintained so that a sensitivity may be improved.

Figure 9:
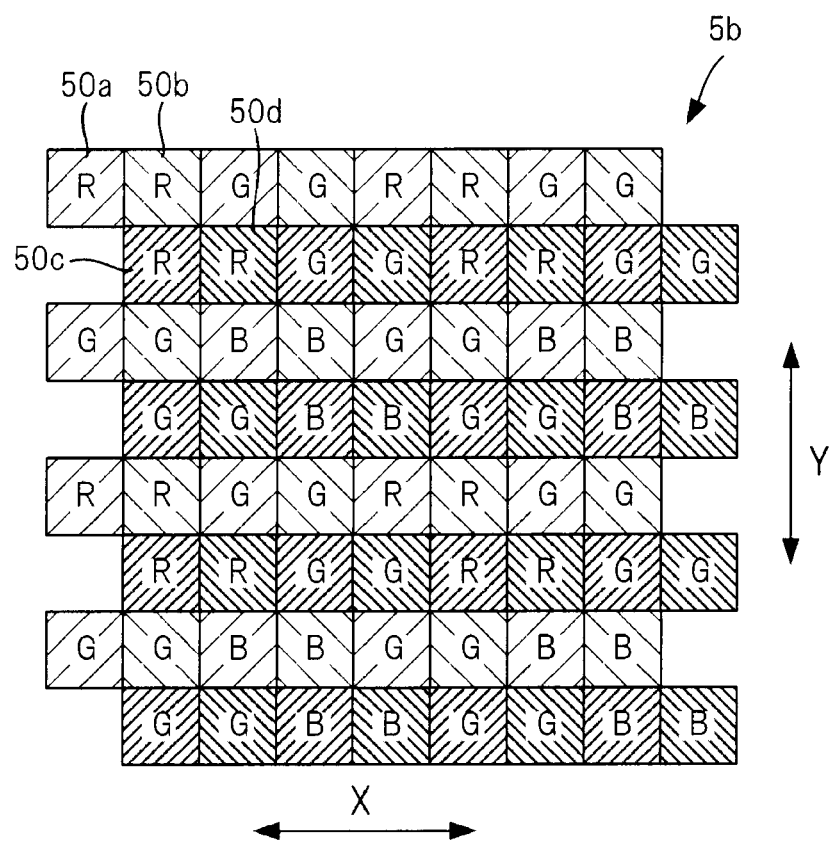
FIG. 9 is a plan view illustrating a configuration of a solid-state imaging element 5b which is a modified example of the solid-state imaging element 5 illustrated in FIG. 2.

FIG. 9 is a plan view illustrating a configuration of a solid-state imaging element 5b which is a modified example of the solid-state imaging element 5 illustrated in FIG. 2.

In the solid-state imaging element 5b, odd-numbered pixel cell rows in the solid-state imaging element 5 are shifted in the row direction X by an arrangement pitch of the pixel cell 50 in the row direction X.

With this configuration, image quality when a live view image or a recording image is generated using both the first pixel cell group and the second pixel cell group may be improved.

With this configuration, when a configuration in which one micro lens is provided for the pair of pixel cells is employed, the micro lens may have a substantially circular shape. Therefore, since a manufacturing method which has been used in the related art is employed, a manufacturing cost may be reduced as compared with the configuration of FIG. 8.

Figure 10:
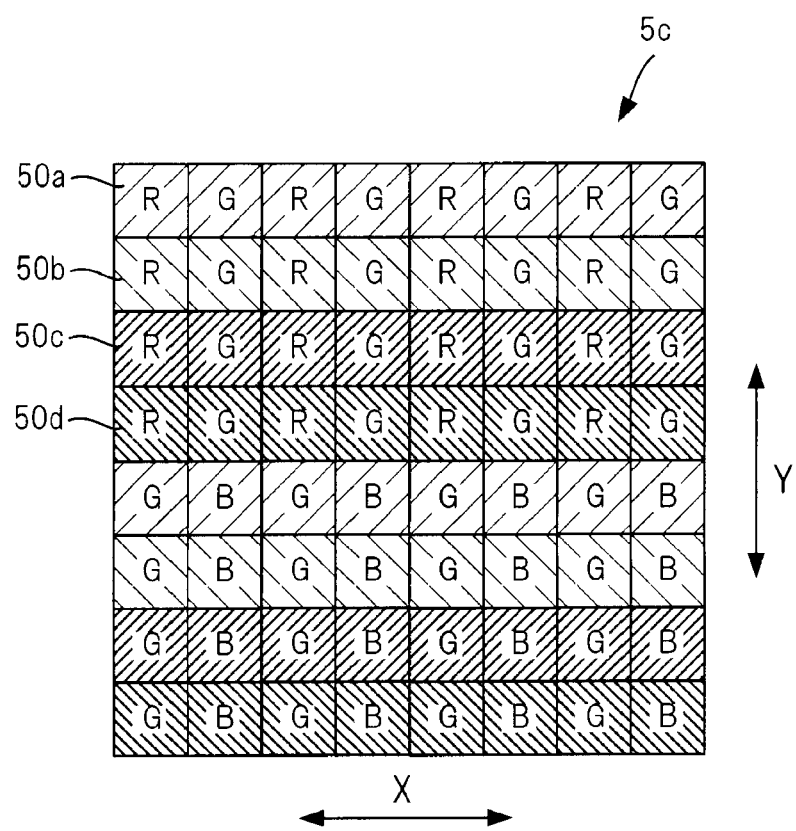
FIG. 10 is a plan view illustrating a configuration of a solid-state imaging element 5c which is a modified example of the solid-state imaging element 5 illustrated in FIG. 2.

FIG. 10 is a plan view illustrating a configuration of a solid-state imaging element 5c which is a modified example of the solid-state imaging element 5 illustrated in FIG. 2.

The solid-state imaging element 5c has a configuration in which a first pair line in which a first pair of a pixel cell 50a and a pixel cell 50b which are adjacent to each other in a column direction Y are in parallel in the row direction X and a second pair line in which a second pair of a pixel cell 50c and a pixel cell 50d which are adjacent to each other in the column direction Y are in parallel in the row direction X are alternately arranged in parallel in the column direction Y.

Also in the solid-state imaging element 5c, the scaling amount of the micro lens is changed (the micro lenses are arranged with different regularities) in the first pair line and the second pair line so that the same effect as that of the solid-state imaging element 5 may be obtained.

Figure 11:
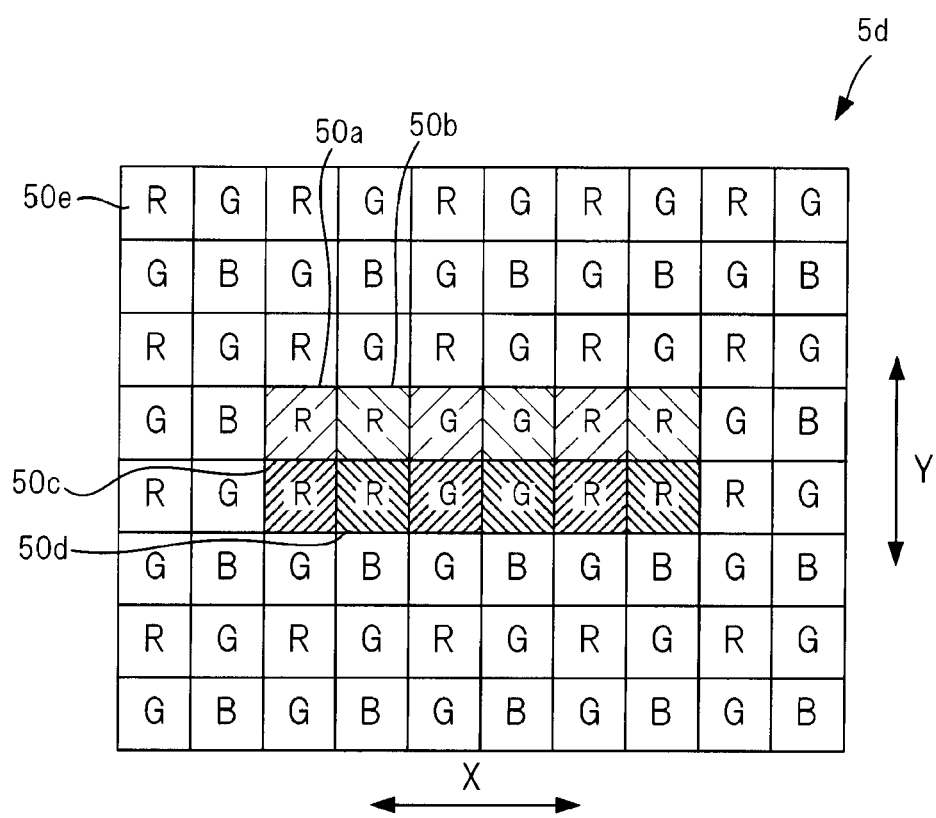
FIG. 11 is a plan view illustrating a configuration of a solid-state imaging element 5d which is a modified example of the solid-state imaging element 5 illustrated in FIG. 2.

FIG. 11 is a plan view illustrating a configuration of a solid-state imaging element 5d which is a modified example of the solid-state imaging element 5 illustrated in FIG. 2.

The solid-state imaging elements 5, 5a, 5b, and 5c do not have a pixel cell (a pixel cell in which a pupil is not divided) which receives both of a pair of luminous fluxes which pass through different pupil areas of the photographing optical system 1. To the contrary, a solid-state imaging element 5d includes pixel cells 50e in which pupils are not divided and pixel cells 50a to 50d in which the pupils are divided, as described above.

In the solid-state imaging element 5d, some of the pixel cells 50e which are two-dimensionally (in a square lattice type in an example of FIG. 11) arranged are formed as pixel cells 50a to 50d.

The scaling of the micro lens is not performed in the pixel cells 50a to 50d in the center of the solid-state imaging element 5d but the scaling of the micro lens is performed only in the pixel cells 50c and 50d of the pixel cells 50a to 50d in the periphery. That is, the micro lenses in the pixel cells 50a and 50b and the pixel cells 50c and 50d are arranged with different regularities.

In a digital camera equipped with the solid-state imaging element 5b, a system control unit 11 performs phase difference AF using a signal which is obtained from the pixel cells 50a to 50d. The system control unit 11 sets a pixel cell which is used for the phase difference AF in accordance with a zoom magnification. For example, when the zoom magnification exceeds a threshold value, the system control unit 11 performs the phase difference AF using the signal from the pixel cells 50a and 50b and when the zoom magnification is equal to or smaller than the threshold value, the system control unit 11 performs the phase difference AF using the signal from the pixel cells 50c and 50d.

As described above, when the solid-state imaging element 5d is used, the precision of phase difference AF may be optimized by the zoom magnification.

In the meantime, in the solid-state imaging element 5d, the pixel cells 50a to 50d are thoroughly arranged without omission so as to cope with both of the 3D photographing and the 2D photographing.

For example, at the time of 3D photographing, stereoscopic image data may be generated using a captured image signal which is obtained by the pixel cells 50a to 50d and at the time of 2D photographing, captured image data may be generated using a captured image signal which is obtained by the pixel cell 50e. In the meantime, at the time of 2D photographing, the signals corresponding to the pixel cells 50a to 50d may be interpolated to be generated using the signal obtained by the pixel cell 50e.

Until now, even though it is described that the pixel cell 50 is equipped with a color filter, the color filter may be omitted. In this case, monochrome captured image data may be obtained.

Next, descriptions will be made on a configuration of a smart phone as an imaging device.

Figure 12:
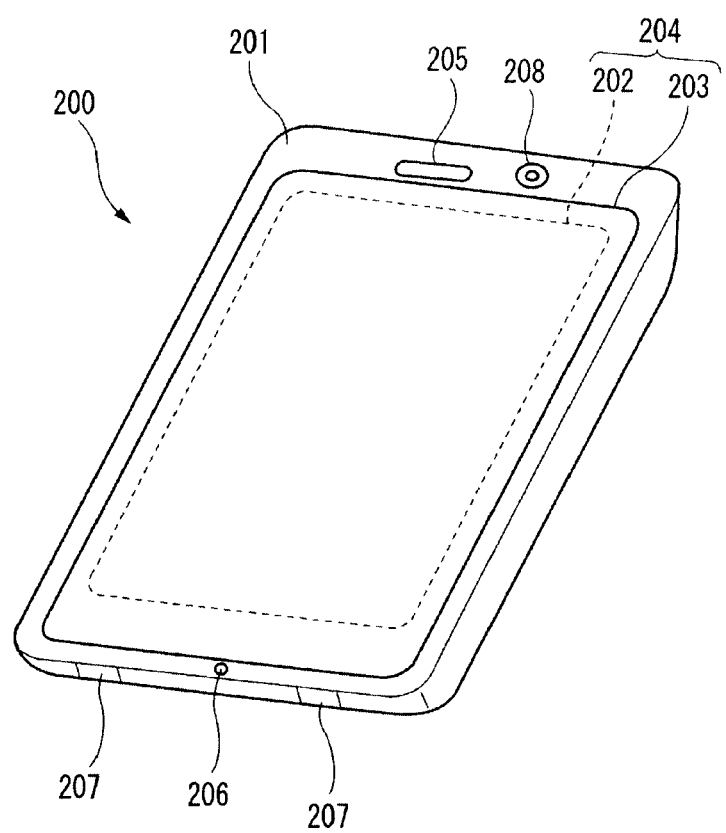
FIG. 12 is a view illustrating a smart phone as an imaging device.

FIG. 12 illustrates an outer appearance of a smart phone 200 which is an embodiment of the imaging device of the present invention. The smart phone 200 illustrated in FIG. 12 includes a flat panel type housing 201 and is provided, on one surface of the housing 201, with a display input unit 204 in which a display panel 202 as a display unit, and a manipulation panel 203 as an input unit are integrated. In addition, such a housing 201 includes a speaker 205, a microphone 206, a manipulation unit 207, and a camera 208. However, the configuration of the housing 201 is not limited thereto. For example, a configuration in which the display unit and the input unit are independent from each other may be employed or a configuration having a folding structure or a slide mechanism may be employed.

Figure 13:
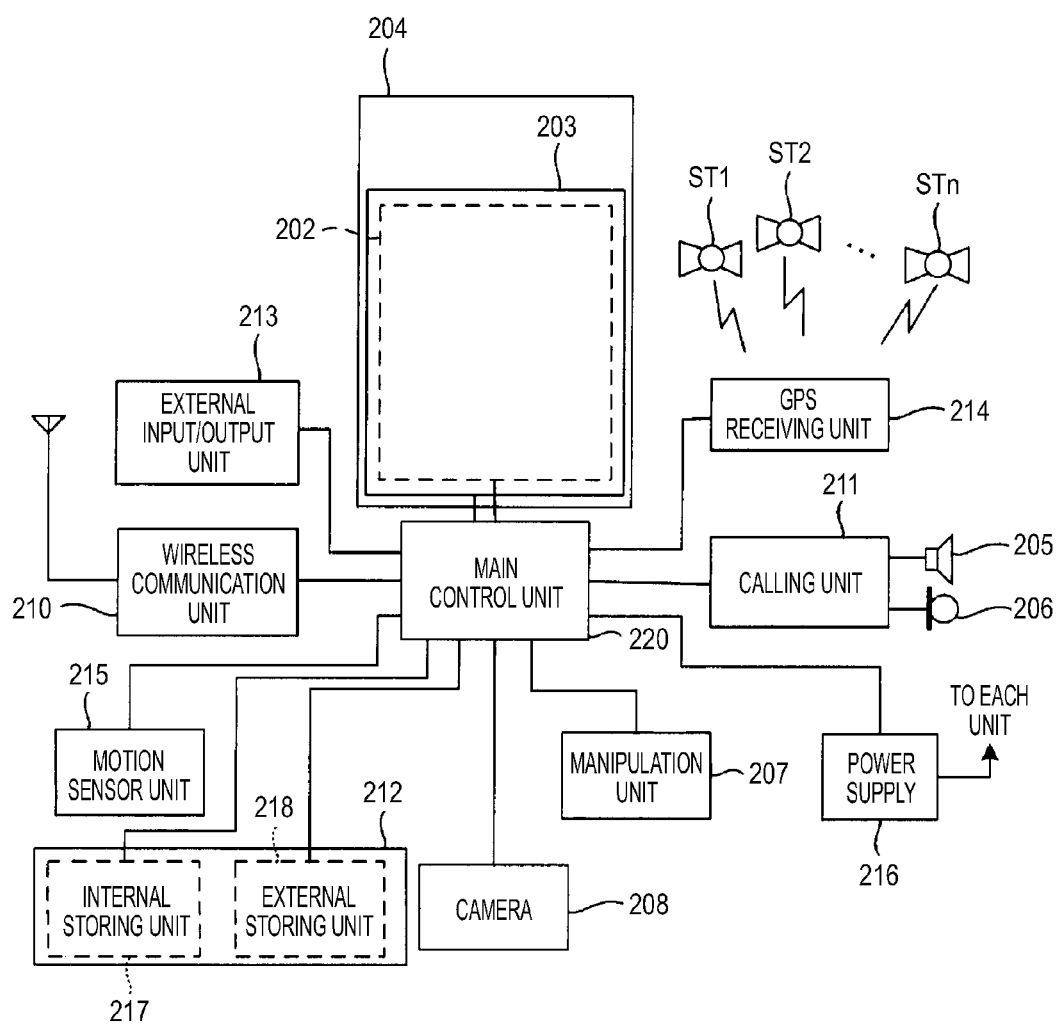
FIG. 13 is an internal block diagram of the smart phone of FIG. 12.

FIG. 13 is a block diagram illustrating a configuration of the smart phone 200 illustrated in FIG. 12. As illustrated in FIG. 13, as main components, the smart phone includes a wireless communication unit 210, a display input unit 204, a calling unit 211, an manipulation unit 207, a camera 208, a storing unit 212, an external input/output unit 213, a global positioning system (GPS) receiving unit 214, a motion sensor unit 215, a power supply 216, and a main control unit 220. Further, as main functions of the smart phone 200, the smart phone 200 has a wireless communication function which performs mobile wireless communication through a base station device BS which is not illustrated and a mobile communication network NW which is not illustrated.

The wireless communication unit 210 performs wireless communication with the base station device BS which is accommodated in the mobile communication network NW in accordance with an instruction of the main control unit 220. Using the wireless communication, the wireless communication unit 210 transmits/receives various file data such as voice data and image data and electronic mail data or receives web data, streaming data, or the like.

The display input unit 204 is provided with a display panel 202 and a manipulation panel 203 as a so-called touch panel which displays an image (a still image or a moving picture) or text information under the control of the main control unit 220 so as to visually transmit information to a user, and detects the user's manipulation on displayed information.

The display panel 202 uses a liquid crystal display (LCD), an organic electroluminescence display (OELD), or the like, as a display device.

The manipulation panel 203 is a device which is disposed to allow an image displayed on a display surface of the display panel 202 to be visually recognized and detects one or a plurality of coordinates which can be manipulated by a finger of the user or a stylus. When the device is manipulated by the finger of the user or the stylus, a detection signal which is generated due to the manipulation is output to the main control unit 220. Subsequently, the main control unit 220 detects a manipulating position (coordinate) on the display panel 202, based on the received detection signal.

As illustrated in FIG. 12, although the display panel 202 and the operating panel 202 of the smart phone 200 exemplified as an embodiment of the imaging device of the present invention are integrally formed with each other to constitute the display input unit 204, the manipulation panel 203 is disposed to completely cover the display panel 202.

When such an arrangement is employed, the manipulation panel 203 may be provided with a function of detecting the user's manipulation on a region other than the display panel 202. In other words, the manipulation panel 203 may include a detection region (hereinafter, referred to as a "display region") on an overlapping portion which overlaps the display panel 202 and a detection region (hereinafter, referred to as a "non-display region") on other outer peripheral portion which does not overlap the display panel 202.

Although the size of the display region and the size of the display panel 202 may completely coincide with each other, both sizes do not necessarily coincide with each other. In addition, the operating panel 203 may include two sensitive regions of an outer peripheral portion and an inner portion other than the outer peripheral portion. Moreover, the width of the outer peripheral portion is appropriately designed in accordance with the size of the housing 201. As a position detecting system employed in the operating panel 203, a matrix switch system, a resistive layer system, a surface elastic wave system, an infrared system, an electromagnetic induction system, or an electrostatic capacitive system may be exemplified, and any system may be employed.

The calling unit 211 includes the speaker 205 or the microphone 206 and converts the user's voice input through the microphone 206 into voice data able to be processed by the main control unit 220 and outputs the converted voice data to the main control unit 220, or decodes voice data received by the wireless communication unit 210 or the external input/output unit 213 and outputs the decoded voice data from the speaker 205. Furthermore, as illustrated in FIG. 12, for example, the speaker 205 may be mounted on the same surface as the surface on which the display input unit 204 is provided and the microphone 206 may be mounted on a side surface of the housing 201

The manipulation unit 207 is a hardware key which uses a key switch and receives an instruction from the user. For example, as illustrated in FIG. 12, the manipulation unit 207 is a push button type switch which is mounted on a side surface of the housing 201 of the smart phone 200 and turned on when the manipulation unit 207 is pressed by a finger and turned off by restoring force of a spring when the finger is detached.

The storing unit 212 stores a control program or control data of the main control unit 220, application software, address data to which names, phone numbers, or the like of communication counterparts are correlated, transmitted/received electronic mail data, web data downloaded by web browsing or downloaded content data, and temporally stores streaming data. Further, the storing unit 212 is configured by an internal storing unit 217 which is mounted in the smart phone and an external storing unit 218 which includes a detachable external memory slot. Furthermore, the internal storing unit 217 and the external storing unit 218 which configure the storing unit 212 are implemented by using a storing medium such as a flash memory type memory, a hard disk type memory, a multimedia card micro type memory, a card type memory (for example, MicroSD (registered trademark) memory), a random access memory (RAM), or a read only memory (ROM).

The external input/output unit 213 functions as an interface with all external devices which are connected to the smart phone 200 and is configured to be directly or indirectly connected to any other external device by communication (for example, universal serial bus (USB) or IEEE1394) or a network (for example, Internet, wireless LAN, Bluetooth (registered trademark), a radio frequency identification (RFID), an infrared data association (IrDA (registered trademark)), ultra wideband (UWB (registered trademark)), or a ZigBee (registered trademark).

As external devices connected to the smart phone 200, a wired/wireless head set, a wired/wireless external charger, a wired/wireless data port, a memory card or a SIM (subscriber identity module) card/UIM (user identity module) card connected through a card socket, an external audio/video device connected through an audio/video input/output (I/O) terminal, a wirelessly connected external audio/video device, a wiredly/wirelessly connected smart phone, a wiredly/wirelessly connected personal computer, a wiredly/wirelessly connected PDA, a wiredly/wirelessly connected personal computer, or an earphone may be exemplified. The external input/output unit 213 transmits data which is received from such external devices to individual internal components of the smart phone 200 and may also allow the data in the smart phone 200 to be transmitted to an external device.

The GPS receiving unit 214 receives GPS signals which are transmitted from GPS satellites ST1 to STn according to an instruction from the main control unit 220 and performs a position measurement operation processing based on the received GPS signals to detect positions including a latitude, a longitude, and a height of the smart phone 200. When the GPS receiving unit 214 may obtain positional information from the wireless communication unit 210 or the external input/output unit 213 (for example, the wireless LAN), the GPS receiving unit 214 may detect a position using the positional information.

The motion sensor unit 215 includes, for example, a three axis acceleration sensor and detects physical movement of the smart phone 200 according to the instruction of the main control unit 220. When the physical movement of the smart phone 200 is detected, the movement direction or acceleration of the smart phone 200 is detected. The detected result is output to the main control unit 220.

The power supply 216 supplies power which is accumulated in a battery (not illustrated) to individual units of the smart phone 200 according to the instruction of the main control unit 220.

The main control unit 220 includes a microprocessor and operates according to a control program or control data stored in the storing unit 212 and collectively and integrally controls the individual units of the smart phone 200. Further, the main control unit 220 is equipped with a mobile communication control function and an application processing function to control individual units of a communication system in order to perform voice communication or data communication through the wireless communication unit 210.

The application processing function is implemented when the main control unit 220 is operated according to the application software which is stored in the storing unit 212. The application processing function includes, for example, an infrared communication function which performs data communication with a counterpart device by controlling the external input/output unit 213, an electronic mail function which transmits/receives an electronic mail, or a web browsing function which browses a web page.

The main control unit 220 is equipped with an image processing function which displays an image on the display input unit 204 based on the image data (still image or moving picture data) such as received data or downloaded streaming data. The image processing function refers to a function of decoding the image data and performing image processings on the decoded result to display the image on the display input unit 204 by the main control unit 220.

The main control unit 220 executes display control of the display panel 202 and manipulation detection control which detects a user's manipulation through the manipulation unit 207 and the operating panel 203. By executing the display control, the main control unit 220 displays an icon to activate an application software or a software key such as a scroll bar or displays a window for preparing an electronic mail. Here, the scroll bar refers to a software key for receiving an instruction to move a displayed portion of an image with respect to a large image which is not covered by the display region of the display panel 202.

When the operation detection control is executed, the main control unit 220 detects the user's operation through the manipulation unit 207 or receives a manipulation on the icon or the input of a character string of an input column of the window through the manipulation panel 203 or receives a scroll request of a displayed image through the scroll bar.

By executing the operation detection control, the main control unit 220 is equipped with a touch panel control function that determines whether the operating position of the operating panel 203 is an overlapping portion (display region) which overlaps he display panel 202 or an outer peripheral portion (non-display region) which does not overlap the display panel 202 other than the overlapping portion, and controls a sensitive region of the operating panel 203 or a display position of the software key.

The main control unit 220 detects a gesture manipulation with respect to the operating panel 203 and executes a predetermined function according to the detected gesture manipulation. The gesture manipulation refers to operation which draws a trace using a finger, designates a plurality of positions simultaneously, or a combination thereof to draw a trace for at least one from the plurality of positions, rather than a simple touch manipulation as in the related art.

The camera 208 includes a configuration other than the external memory control unit 20, the recording medium 21, the display control unit 22, the display unit 23, and the manipulation unit 14 in the digital camera which is illustrated in FIG. 1. Captured image data which is generated by the camera 208 may be stored in the storing unit 212 or output through the external input/output unit 213 or the wireless communication unit 210. As illustrated in FIG. 12, although the camera 208 is mounted on the same surface as the display input unit 204 in the smart phone 200, the mounting position of the camera 208 is not limited thereto and the camera 208 may be mounted on a rear surface of the display input unit 204.

The camera 208 may be used for various functions of the smart phone 200. For example, an image which is obtained by the camera 208 may be displayed on the display panel 202 or the image of the camera 208 may be used as one of operation inputs of the manipulation panel 203. Further, when the GPS receiving unit 214 detects the position, the position may be detected with reference to the image from the camera 208. Moreover, an optical axis direction of the camera 208 of the smart phone 200 may be determined or a current usage environment may also be determined with reference to the image from the camera 208, either without using the 3-axis acceleration sensor or using the 3-axis acceleration sensor. Of course, the image from the camera 208 can be used in the application software Positional information obtained by the GPS receiving unit 214, voice information obtained by the microphone 206 (which may be text information obtained by performing a voice-text conversion by the main control unit or the like), or posture information obtained by the motion sensor unit 215 may be added to the image data of a still image or a moving picture to be stored in the storing unit 212 or output through the external input/output unit 213 or the wireless communication unit 210.

In the smart phone 200 with the above-described configuration, the main control unit 220 performs the same processing as the system control unit 11 of the digital camera 1 illustrated in FIG. 1, so that photographing may be performed with less deteriorated image quality from a telescopic side to a wide angle side.

As described above, the following matters are disclosed herein.

It is disclosed an imaging device including an imaging element which outputs a pair of image signals corresponding to a pair of luminous fluxes which pass through different pupil areas of a photographing optical system, in which the imaging element includes a first pixel cell group including a plurality of first pixel cells for obtaining the pair of image signals and a second pixel cell group including a plurality of second pixel cells for obtaining the pair of image signals, the first pixel cell includes a first photoelectric converting unit and a first micro lens which is provided above the first photoelectric converting unit, the second pixel cell includes a second photoelectric converting unit and a second micro lens which is provided above the second photoelectric converting unit, the first micro lens and the second micro lens are disposed with different regularities, and the imaging device includes: a control unit that selectively performs a first control to adjust a focus of the photographing optical system based on the pair of image signals read from the first pixel cell group and a second control to adjust the focus of the photographing optical system based on the pair of image signals read from the second pixel cell group, depending on an incident angle of light onto the imaging element.

It is disclosed the imaging device, in which a position of the first micro lens in the first pixel cell is shifted to a center of the imaging element as the position of the first pixel cell goes from the center of the imaging element to a periphery thereof, a position of the second micro lens in the second pixel cell is shifted to the center of the imaging element as the position of the second pixel cell goes from the center of the imaging element to a periphery thereof, and shift amounts of the first micro lens and the second micro lens, which are disposed approximately at the same distance from the center of the imaging element, with respect to the center are different from each other.

It is disclosed the imaging device, in which the first micro lenses are disposed at the same position in all the first pixel cells, and a position of the second micro lens in the second pixel cell is shifted to the center of the imaging element as the position of the second pixel cell goes from the center of the imaging element to a periphery thereof.

It is disclosed the imaging device, in which the first pixel cell group is configured in such a manner that a plurality of pairs of first pixel cells are two dimensionally disposed, and in each pair of first pixel cells, one of the pair of first pixel cells receives one of the pair of luminous fluxes and the other one of the pair of first pixel cells is adjacent to the one of the pair of first pixel cells and receives the other one of the pair of luminous fluxes, and the second pixel cell group is configured in such a manner that a plurality of pairs of second pixel cells are two dimensionally disposed, and in each pair of second pixel cells, one of the pair of second pixel cells receives one of the pair of luminous fluxes and the other one of the pair of second pixel cells is adjacent to the one of the pair of second pixel cells and receives the other one of the pair of luminous fluxes.

It is disclosed the imaging device, in which the pixel cells include a plurality of types of pixel cells which detects different color light, all pairs of pixel cells are configured by the same type of pixel cells, and the pair of second pixels which detects light having the same color as the pair of first pixel cells are disposed so as to be adjacent to the pair of first pixel cells.

It is disclosed the imaging device including an imaging element which outputs a pair of image signals corresponding to a pair of luminous fluxes which pass through different pupil areas of a photographing optical system, in which the imaging element includes a first pixel cell group including a plurality of first pixel cells for obtaining the pair of image signals and a second pixel cell group including a plurality of second pixel cells for obtaining the pair of image signals, the first pixel cell includes a first photoelectric converting unit and a first micro lens which is provided above the first photoelectric converting unit, the second pixel cell includes a second photoelectric converting unit and a second micro lens which is provided above the second photoelectric converting unit, the first micro lens and the second micro lens are disposed with different regularities, and the imaging device includes: a control unit that selectively performs a first control to generate and record captured image data based on the pair of image signals read from the first pixel cell group and a second control to generate and record the captured image data based on the pair of image signals read from the second pixel cell group, depending on an incident angle of light onto the imaging element.

It is disclosed the imaging device, in which the control unit selectively performs third control to generate and record the captured image data using the pair of image signals read from the first pixel cell group and the pair of image signals read from the second pixel cell group, depending on the incident angle.

It is disclosed an imaging element which outputs a pair of image signals corresponding to a pair of luminous fluxes which pass through different pupil areas of a photographing optical system, the imaging element including: a first pixel cell group including a plurality of first pixel cells for obtaining the pair of image signals; and a second pixel cell group including a plurality of second pixel cells for obtaining the pair of image signals; in which the first pixel cell includes a first photoelectric converting unit and a first micro lens which is provided above the first photoelectric converting unit, the second pixel cell includes a second photoelectric converting unit and a second micro lens which is provided above the second photoelectric converting unit, and the first micro lens and the second micro lens are disposed with different regularities.

It is disclosed the imaging element, in which a position of the first micro lens in the first pixel cell is shifted to a center of the imaging element as the position of the first pixel cell goes from the center of the imaging element to a periphery thereof, a position of the second micro lens in the second pixel cell is shifted to the center of the imaging element as the position of the second pixel cell goes from the center of the imaging element to a periphery thereof, and shift amounts of the first micro lens and the second micro lens, which are disposed approximately at the same distance from the center of the imaging element, with respect to the center are different from each other.

It is disclosed the imaging element, in which the first micro lenses are disposed at the same position in all the first pixel cells and a position of the second micro lens in the second pixel cell is shifted to the center of the imaging element as the position of the second pixel cell goes from the center of the imaging element to a periphery thereof.

It is disclosed the imaging element, in which the first pixel cell group is configured in such a manner that a plurality of pairs of first pixel cells are two dimensionally disposed, and in each pair of first pixel cells, one of the pair of first pixel cells receives one of the pair of luminous fluxes and the other one of the pair of first pixel cells is adjacent to the one of the pair of first pixel cells and receives the other one of the pair of luminous fluxes, and the second pixel cell group is configured in such a manner that a plurality of pairs of second pixel cells are two dimensionally disposed, and in each pair of second pixel cells, one of the pair of second pixel cells receives one of the pair of luminous fluxes and the other one of the pair of second pixel cells is adjacent to the one of the pair of second pixel cells and receives the other one of the pair of luminous fluxes.

It is disclosed the imaging element, in which the pixel cells include a plurality of types of pixel cells which detects different color light, all pairs of pixel cells are configured by the same type of pixel cells, and the pair of second pixels which detects light having the same color as the pair of first pixel cells are disposed so as to be adjacent to the pair of first pixel cells.

It is disclosed an imaging method using the imaging element, including: selectively performing a first control to adjust a focus of the photographing optical system based on the pair of image signals read from the first pixel cell group and a second control to adjust the focus of the photographing optical system based on the pair of image signals read from the second pixel cell group, depending on an incident angle of light onto the imaging element.

It is disclosed an imaging method using the imaging element, including: selectively performing a first control to generate and record captured image data based on the pair of image signals read from the first pixel cell group and a second control to generate and record the captured image data based on the pair of image signals read from the second pixel cell group, depending on an incident angle of light onto the imaging element.

According to the present invention, an imaging element which may achieve satisfactory imaging quality regardless of an incident angle of light and an imaging device and an imaging method using the same may be provided.

Although the present invention has been described above by the specific embodiment, the present invention is not limited to the embodiment but various modifications may be made without departing from a technical spirit of the disclosed invention.

The present application is based on Japanese Patent Application No. 2012-074307 filed on Mar. 28, 2012, the entire contents of which are incorporated herein by reference.

What is claimed is:

1. An imaging device including an imaging element which outputs a pair of image signals corresponding to a pair of luminous fluxes which pass through different pupil areas of a photographing optical system,
wherein the imaging element includes a first pixel cell group including a plurality of first pixel cells for obtaining the pair of image signals and a second pixel cell group including a plurality of second pixel cells for obtaining the pair of image signals,
each of the plurality of first pixel cells includes a first photoelectric converting unit and a first micro lens which is provided above the first photoelectric converting unit,
each of the plurality of second pixel cells includes a second photoelectric converting unit and a second micro lens which is provided above the second photoelectric converting unit,
a position of the first micro lens within the first pixel cell and a position of the second micro lens within the second pixel cell are set with different regularities, wherein a shift amount of the first micro lens from a center of the first pixel cell is different from a shift amount of the second micro lens from a center of the second pixel cell, and
the imaging device comprises a control unit that selectively performs a first control to adjust a focus of the photographing optical system based on the pair of image signals read from the first pixel cell group and a second control to adjust the focus of the photographing optical system based on the pair of image signals read from the second pixel cell group, depending on an incident angle of light onto the imaging element.

2. The imaging device of claim 1, wherein a position of the first micro lens in the first pixel cell is shifted to a center of the imaging element as the position of the first pixel cell goes from the center of the imaging element to a periphery thereof, and
a position of the second micro lens in the second pixel cell is shifted to the center of the imaging element as the position of the second pixel cell goes from the center of the imaging element to a periphery thereof.

3. The imaging device of claim 1, wherein the first micro lenses are disposed at the same position in all the first pixel cells, and
a position of the second micro lens in the second pixel cell is shifted to the center of the imaging element as the position of the second pixel cell goes from the center of the imaging element to a periphery thereof.

4. The imaging device of claim 1, wherein the first pixel cell group is configured in such a manner that a plurality of pairs of first pixel cells are two dimensionally disposed, and in each pair of first pixel cells, one of the pair of first pixel cells receives one of the pair of luminous fluxes and the other one of the pair of first pixel cells is adjacent to the one of the pair of first pixel cells and receives the other one of the pair of luminous fluxes, and
the second pixel cell group is configured in such a manner that a plurality of pairs of second pixel cells are two dimensionally disposed, and in each pair of second pixel cells, one of the pair of second pixel cells receives one of the pair of luminous fluxes and the other one of the pair of second pixel cells is adjacent to the one of the pair of second pixel cells and receives the other one of the pair of luminous fluxes.

5. The imaging device of claim 4, wherein the pixel cells include a plurality of types of pixel cells which detects different color light,
all pairs of pixel cells are configured by the same type of pixel cells, and
the pair of second pixels which detects light having the same color as the pair of first pixel cells are disposed so as to be adjacent to the pair of first pixel cells.

6. An imaging device including an imaging element which outputs a pair of image signals corresponding to a pair of luminous fluxes which pass through different pupil areas of a photographing optical system, wherein the imaging element includes a first pixel cell group including a plurality of first pixel cells for obtaining the pair of image signals and a second pixel cell group including a plurality of second pixel cells for obtaining the pair of image signals, each of the plurality of first pixel cells includes a first photoelectric converting unit and a first micro lens which is provided above the first photoelectric converting unit, each of the plurality of second pixel cells includes a second photoelectric converting unit and a second micro lens which is provided above the second photoelectric converting unit, a position of the first micro lens within the first pixel cell and a position of the second micro lens within the second pixel cell are set with different regularities, wherein a shift amount of the first micro lens from a center of the first pixel cell is different from a shift amount of the second micro lens from a center of the second pixel cell, and the imaging device comprises a control unit that selectively performs a first control to generate and record captured image data based on the pair of image signals read from the first pixel cell group and a second control to generate and record the captured image data based on the pair of image signals read from the second pixel cell group, depending on an incident angle of light onto the imaging element.

7. The imaging device of claim 6, wherein the control unit selectively performs third control to generate and record the captured image data using the pair of image signals read from the first pixel cell group and the pair of image signals read from the second pixel cell group, depending on the incident angle.

8. An imaging element which outputs a pair of image signals corresponding to a pair of luminous fluxes which pass through different pupil areas of a photographing optical system, the imaging element comprising:

a first pixel cell group including a plurality of first pixel cells for obtaining the pair of image signals; and a second pixel cell group including a plurality of second pixel cells for obtaining the pair of image signals;

wherein each of the plurality of first pixel cells includes a first photoelectric converting unit and a first micro lens which is provided above the first photoelectric converting unit, each of the plurality of second pixel cells includes a second photoelectric converting unit and a second micro lens which is provided above the second photoelectric converting unit, and a position of the first micro lens within the first pixel cell and a position of the second micro lens within the second pixel cell are set with different regularities, wherein a shift amount of the first micro lens from a center of the first pixel cell is different from a shift amount of the second micro lens from a center of the second pixel cell.

9. The imaging element of claim 8, wherein a position of the first micro lens in the first pixel cell is shifted to a center of the imaging element as the position of the first pixel cell goes from the center of the imaging element to a periphery thereof, and a position of the second micro lens in the second pixel cell is shifted to the center of the imaging element as the position of the second pixel cell goes from the center of the imaging element to a periphery thereof.

10. The imaging element of claim 8, wherein the first micro lenses are disposed at the same position in all the first pixel cells, and a position of the second micro lens in the second pixel cell is shifted to the center of the imaging element as the position of the second pixel cell goes from the center of the imaging element to a periphery thereof.

11. The imaging element of claim 8, wherein the first pixel cell group is configured in such a manner that a plurality of pairs of first pixel cells are two dimensionally disposed, and in each pair of first pixel cells, one of the pair of first pixel cells receives one of the pair of luminous fluxes and the other one of the pair of first pixel cells is adjacent to the one of the pair of first pixel cells and receives the other one of the pair of luminous fluxes, and the second pixel cell group is configured in such a manner that a plurality of pairs of second pixel cells are two dimensionally disposed, and in each pair of second pixel cells, one of the pair of second pixel cells receives one of the pair of luminous fluxes and the other one of the pair of second pixel cells is adjacent to the one of the pair of second pixel cells and receives the other one of the pair of luminous fluxes.

12. The imaging element of claim 11, wherein the pixel cells include a plurality of types of pixel cells which detects different color light, all pairs of pixel cells are configured by the same type of pixel cells, and the pair of second pixels which detects light having the same color as the pair of first pixel cells are disposed so as to be adjacent to the pair of first pixel cells.

13. An imaging method using the imaging element of claim 8, comprising:

selectively performing a first control to adjust a focus of the photographing optical system based on the pair of image signals read from the first pixel cell group and a second control to adjust the focus of the photographing optical system based on the pair of image signals read from the second pixel cell group, depending on an incident angle of light onto the imaging element.

14. An imaging method using the imaging element of claim 8, comprising:

selectively performing a first control to generate and record captured image data based on the pair of image signals read from the first pixel cell group and a second control to generate and record the captured image data based on the pair of image signals read from the second pixel cell group, depending on an incident angle of light onto the imaging element.

* * * * *